United States Patent
Shi

(10) Patent No.: US 10,361,226 B2
(45) Date of Patent: Jul. 23, 2019

(54) ARRAY SUBSTRATE, MANUFACTURING METHOD FOR THE SAME AND DISPLAY PANEL

(71) Applicant: Shenzhen China Star Optoelectronics Semiconductor Display Technology Co., Ltd., Shenzhen, Guangdong (CN)

(72) Inventor: Longqiang Shi, Guangdong (CN)

(73) Assignee: Shenzhen China Star Optoelectronics Semiconductor Display Technology Co., Ltd., Shenzhen, Guangdong (CN)

(*) Notice: Subject to any disclaimer, the term of this patent is extended or adjusted under 35 U.S.C. 154(b) by 0 days.

(21) Appl. No.: 15/739,705

(22) PCT Filed: Aug. 22, 2017

(86) PCT No.: PCT/CN2017/098441
§ 371 (c)(1),
(2) Date: Dec. 23, 2017

(87) PCT Pub. No.: WO2019/010758
PCT Pub. Date: Jan. 17, 2019

(65) Prior Publication Data
US 2019/0019817 A1     Jan. 17, 2019

(30) Foreign Application Priority Data
Jul. 12, 2017   (CN) .......................... 2017 1 0565700

(51) Int. Cl.
| | | |
|---|---|---|
| H01L 27/12 | (2006.01) | |
| H01L 29/786 | (2006.01) | |
| H01L 33/06 | (2010.01) | |

(52) U.S. Cl.
CPC ...... *H01L 27/1251* (2013.01); *H01L 27/1229* (2013.01); *H01L 27/1248* (2013.01); *H01L 27/1262* (2013.01); *H01L 27/1274* (2013.01); *H01L 29/7869* (2013.01); *H01L 29/78678* (2013.01); *H01L 33/06* (2013.01)

(58) Field of Classification Search
CPC .......... H01L 27/1251; H01L 29/78678; H01L 27/1274; H01L 27/1248; H01L 27/1262; H01L 27/1229; H01L 33/06; H01L 29/7869
See application file for complete search history.

(56) References Cited

U.S. PATENT DOCUMENTS

2017/0278916 A1* 9/2017 Maruyama .......... H01L 27/3276
2017/0294460 A1* 10/2017 Lee .................... H01L 27/1251

* cited by examiner

*Primary Examiner* — Selim U Ahmed
(74) *Attorney, Agent, or Firm* — Andrew C. Cheng

(57) ABSTRACT

The present invention discloses an array substrate, manufacturing method for the same and display panel. The present invention adopts a vertical superposition method to connect the QLED device with the TFT. When applying a voltage, the first semiconductor pattern and the second semiconductor pattern respectively generate electron holes and electrons to move toward the QLED device. The electron holes and electrons are recombined in the light-emitting layer to emit a light such that the light can be emitted right above the QLED device in order to realize a light-emitting at a TFT region, and increase the aperture ratio of the display panel.

12 Claims, 4 Drawing Sheets

ARRAY SUBSTRATE, MANUFACTURING METHOD FOR THE SAME AND DISPLAY PANEL

BACKGROUND OF THE INVENTION

1. Field of the Invention

The present invention relates to a display technology field, and more particularly to an array substrate, a manufacturing method for the same and a display panel.

2. Description of Related Art

As a display technology having a great market prospects, a QLED (Quantum Dot Light Emitting Diodes) has been widely attended by the industry, and the QLED technology has a great development in a short time. Currently, the QLED device can be integrated with a thin-film transistor (TFT), and through the TFT to control the QLED device to emit a light. However, the number of elements of the conventional TFT is more, and most of the elements are not transparent such that the light emitted from the QLED device is shielded in order to affect aperture ratio of the display panel.

SUMMARY OF THE INVENTION

Accordingly, the present invention provides an array substrate and a manufacturing for the same and a display panel, which can increase the aperture ratio of the display panel.

An array substrate of an embodiment of the present invention, comprising:

a substrate;

a first gate electrode pattern formed on the substrate and a first insulation layer covered on the first gate electrode pattern;

a first semiconductor pattern formed on the first insulation layer, wherein, the first semiconductor pattern is located right above the first gate electrode pattern for generating electron holes when applying with a voltage;

a bank layer that covers the first semiconductor pattern, wherein, the bank layer is provided with a concave slot and two first contact holes located outside the concave slot, the concave slot and the two first contact holes all reveal a surface of the first semiconductor pattern;

a QLED device formed in the concave slot and contacted with the first semiconductor pattern;

a second semiconductor pattern formed on the bank layer for generating electrons when applying with a voltage, wherein, the second semiconductor pattern directly covers on the QLED device and the two first contact holes, and electrically connected to the first semiconductor pattern through the two first contact holes;

a second insulation layer covered on the second semiconductor pattern, wherein, the second insulation layer is provided with two second contact holes that reveal a surface of the second semiconductor pattern;

source electrode pattern and a drain electrode pattern disposed separately on the second insulation layer, wherein, the source electrode pattern and the drain electrode pattern cover the two second contact holes, and the source electrode pattern and the drain electrode pattern are electrically connect to the second semiconductor pattern through the two second contact holes;

a third insulation layer covered on the source electrode pattern and the drain electrode pattern; and a second gate electrode pattern formed on the third insulation layer, wherein, the second gate electrode pattern is a transparent electrode pattern and located right above the QLED device.

A display panel of an embodiment of the present invention, comprising:

a substrate;

a first gate electrode pattern formed on the substrate and a first insulation layer covered on the first gate electrode pattern;

a first semiconductor pattern formed on the first insulation layer, wherein, the first semiconductor pattern is located right above the first gate electrode pattern for generating electron holes when applying with a voltage;

a bank layer that covers the first semiconductor pattern, wherein, the bank layer is provided with a concave slot and two first contact holes located outside the concave slot, the concave slot and the two first contact holes all reveal a surface of the first semiconductor pattern;

a QLED device formed in the concave slot and contacted with the first semiconductor pattern;

a second semiconductor pattern formed on the bank layer for generating electrons when applying with a voltage, wherein, the second semiconductor pattern directly covers on the QLED device and the two first contact holes, and electrically connected to the first semiconductor pattern through the two first contact holes;

a second insulation layer covered on the second semiconductor pattern, wherein, the second insulation layer is provided with two second contact holes that reveal a surface of the second semiconductor pattern;

source electrode pattern and a drain electrode pattern disposed separately on the second insulation layer, wherein, the source electrode pattern and the drain electrode pattern cover the two second contact holes, and the source electrode pattern and the drain electrode pattern are electrically connect to the second semiconductor pattern through the two second contact holes;

a third insulation layer covered on the source electrode pattern and the drain electrode pattern; and a second gate electrode pattern formed on the third insulation layer, wherein, the second gate electrode pattern is a transparent electrode pattern and located right above the QLED device.

A manufacturing method for an array substrate of an embodiment of the present invention, comprising steps of:

sequentially forming a first gate electrode pattern and a first insulation layer that covers the first gate electrode pattern on a substrate;

forming a first semiconductor pattern on the first insulation layer, and the first semiconductor pattern is located right above the first gate electrode pattern for generating electron holes when applying with a voltage;

forming a bank layer covering the first semiconductor pattern, wherein the bank layer is provided with a concave slot, and forming a QLED device located in the concave slot and contacted with the first semiconductor pattern, wherein, the bank layer is also provided with two first contact holes located outside the concave slot and revealing a surface of the first semiconductor pattern;

forming a second semiconductor pattern on the bank layer, wherein, the second semiconductor pattern is used for applying with a voltage in order to generate electrons, and the second semiconductor pattern directly covers the QLED device and the two first contact holes, and the second semiconductor pattern can electrically connect to the first semiconductor pattern through the two first contact holes;

forming a second insulation layer that covers the second semiconductor pattern, wherein, the second insulation layer is provided with two second contact holes that reveal a surface of the second semiconductor pattern;

forming a source electrode pattern and a drain electrode pattern which are disposed separately on the second insulation layer, wherein, the source electrode pattern and the drain electrode pattern cover the two second contact holes, and the source electrode pattern and the drain electrode pattern can electrically connect to the second semiconductor pattern through the two second contact holes; and forming a second gate electrode pattern on the third insulation layer, wherein, the second gate electrode pattern is a transparent electrode pattern and located right above the QLED device.

Beneficial effect: the present invention designs a source electrode pattern and a drain electrode pattern to be connected with the second semiconductor pattern as an upper electrode of the QLED device, and using the first semiconductor pattern as a lower electrode of the QLED device. That is, using a vertical superposition method to connect the QLED device with the TFT. When applying positive and negative voltages to the second gate electrode pattern and the first gate electrode pattern, the first semiconductor pattern and the second semiconductor pattern respectively generate electron holes and electrons to move toward the QLED device. The electron holes and electrons are recombined in the light-emitting layer to emit a light such that the light can be emitted right above the QLED device in order to realize a light-emitting at a TFT region, and increase the aperture ratio of the display panel.

DETAILED DESCRIPTION OF THE PREFERRED EMBODIMENT

The following will combine the figures in the embodiments of the present invention to illustrate the technology solution clearly and completely. Without conflicting, the following embodiments and technology features in the embodiments can be combined with each other.

Figure 1:
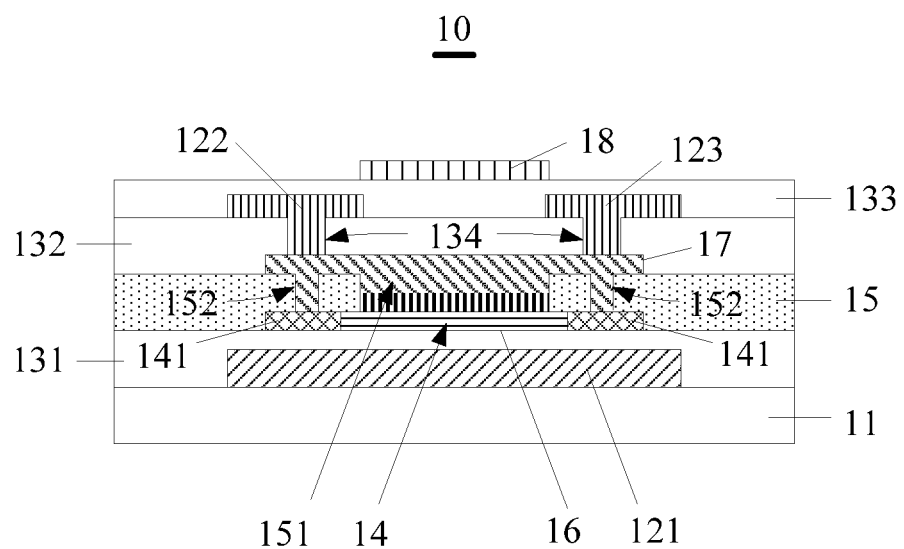
FIG. 1 is a cross-sectional view of an array substrate according to an embodiment of the present invention.

FIG. 1 is a cross-sectional view of an array substrate according to an embodiment of the present invention. As shown in FIG. 1, an array substrate 10 of the present embodiment includes a substrate 11 and elements formed on layers of the substrate, and including: a first gate electrode pattern 121, a first insulation layer 131, a first semiconductor pattern 14, a bank layer 15, an QLED device 16, a second semiconductor pattern 17, a second insulation layer 132, a source electrode pattern 122, a drain electrode pattern 123, a third insulation layer 133 and a second gate electrode pattern 18.

The first insulation layer 131 is also known as a gate insulation layer (GI), which is formed on the substrate 11 and covering on the first gate electrode pattern 121.

The first semiconductor pattern 14 is formed on the first insulation layer 131 and is located right above the first gate electrode pattern 121.

The bank layer 15 is formed on the first insulation layer 131 and covering on the first semiconductor pattern 14, and the bank layer 15 is provided with a concave slot 151 and two first contact holes 152 located outside the concave slot 151. Sizes of the two first contact holes 152 can be the same, and a size of the concave slot 151 is greater than the size of anyone of the first contact holes 152. The concave slot 151 and the two first contact holes 152 can be regarded as openings of the bank layer 15, and the openings are used for exposing the surface of the first semiconductor pattern 14.

The QLED device 16 is formed in the concave slot 151, and is contacted with the first semiconductor pattern 14.

The second semiconductor pattern 17 is formed on the bank layer 15, and directly covers the QLED device 16 and the two first contact holes 152. The second semiconductor pattern 17 is electrically connected to the first semiconductor pattern 14 through the two first contact holes 152.

The second insulation layer 132 is formed on the bank layer 15 and covering on the second semiconductor pattern 17. The second insulation layer 132 is provided with two second contact holes 134 that reveal a surface of the second semiconductor pattern 17.

The source electrode pattern 122 and the drain electrode pattern 123 are disposed at a same layer, and are disposed separately on the second insulation layer 132. The source electrode pattern 122 covers one of the two contact holes 134, the drain electrode pattern 123 covers the other of the two contact holes 134. The source electrode pattern 122 and the drain electrode pattern 123 can electrically connect to the second semiconductor pattern 17 respectively through the two second contact holes 134.

The third insulation layer 133 is formed on the second insulation layer 132, and covering the source electrode pattern 122 and the drain electrode pattern 123.

The second gate electrode pattern 18 is formed on the third insulation layer 133, and located right above the QLED device 16. The second gate electrode pattern 18 can be a transparent electrode pattern, and a material of the second gate electrode pattern 18 can include but not limited to ITO (Indium Tin Oxide).

Wherein, a region that the first gate electrode pattern 121, the source electrode pattern 122 and the drain electrode pattern 123 are located is a TFT region of the array substrate 10. Because the QLED device 16 is disposed between the first gate electrode pattern 121 and the source electrode pattern 122 (or the drain electrode pattern 123), the present embodiment is equal to adopt a vertical superposition method to connect the QLED device 16 with the TFT.

Besides, the source electrode pattern 122 and the drain electrode pattern 123 are connected to the second semiconductor pattern 17, and the second semiconductor pattern 17 covers the QLED device 16. That is, the source electrode pattern 122 and the drain electrode pattern 123 are connected with an upper electrode of the QLED device 16. In other words, the source electrode pattern 122 and the drain electrode pattern 123 can be regarded as an upper electrode of the QLED device 16. The first semiconductor pattern 14 is connected with the QLED device 16. That is, the first semiconductor pattern 14 is connected with a lower electrode of the QLED device 16. In other words, the first semiconductor pattern 14 can be regarded as a lower electrode of the QLED device 16.

Then, when applying a positive voltage at the second gate electrode pattern 18, and applying a negative voltage at the first gate electrode pattern 121, atoms in the first semiconductor pattern 14 will gather to form electron holes. Using a P-type LTPS (Low Temperature Poly-silicon) pattern as an example, the polysilicon (P—Si) in the P-type LTPS pattern will gather to form electron holes, and the second semiconductor pattern 17 will generate electrons.

When applying a voltage difference between the source electrode pattern 122 and the drain electrode pattern 123, for example, applying a grayscale voltage at the source electrode pattern 122, and not applying a voltage at the drain electrode pattern 123, electrons are moved in the second semiconductor pattern 17 driven by an electric field force provided by the voltage difference, and the electron holes are moved in the first semiconductor pattern 14 driven by the electric field force such that the electrons and the electron holes moved toward the QLED device 16 will gather in a light-emitting layer of the QLED device 16 in order to form excitons. A recombination of the excitons can emit a light. Because the second semiconductor pattern 17, the second insulation layer 132, the third insulation layer 133 and the second gate electrode pattern 18 can be made by transparent materials, a light emitted by the QLED device 16 can be emitted from the second gate electrode pattern 18 located right above the QLED device 16 in order to realize an emitting of the TFT region. Comparing with the conventional art, an emitting area of each pixel of the present embodiment is increased so as to increase an aperture ratio of the display panel.

In the present embodiment, the second semiconductor pattern 17 can be an N-type IGZO (Indium Gallium Zinc Oxide) pattern. The first semiconductor pattern 14 can be a P-type LTPS pattern after being heavy doped. Specifically, a middle region of the first semiconductor pattern 14 is not heavy doped, and two terminals of the first semiconductor pattern 14 is a heavy-doped region 141 doped with boron ions. Accordingly, the second semiconductor pattern 17 is electrically connected with the heavy-doped region 141 of the first semiconductor pattern 14 through the two first contact holes 152 such that a contact resistance is smaller.

The following will illustrate a manufacturing method for an array substrate 10 of the embodiment shown in FIG. 1.

Figure 2:
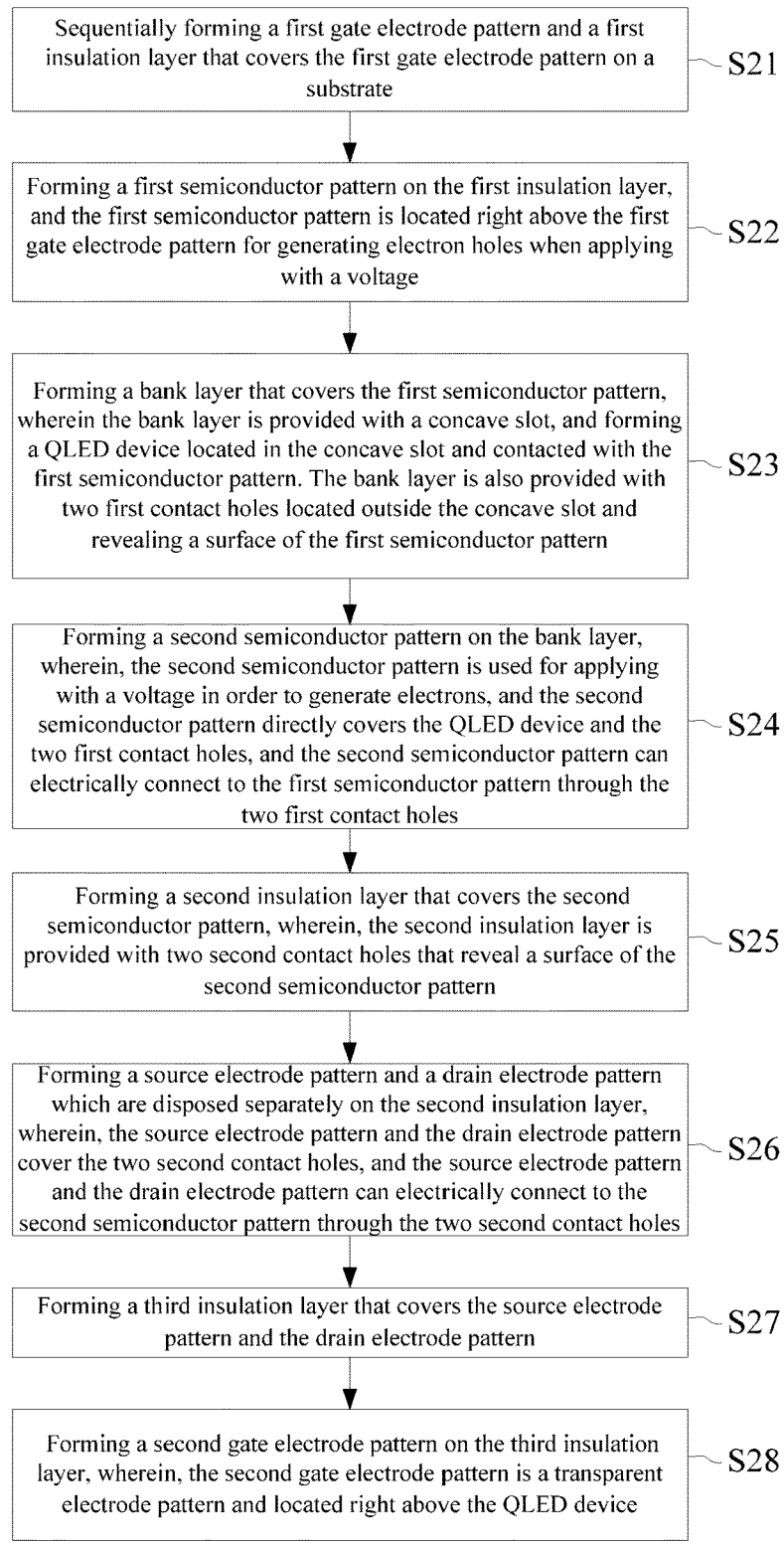
FIG. 2 is a flow chart of a manufacturing method for an array substrate according to an embodiment of the present invention.
Figure 3:
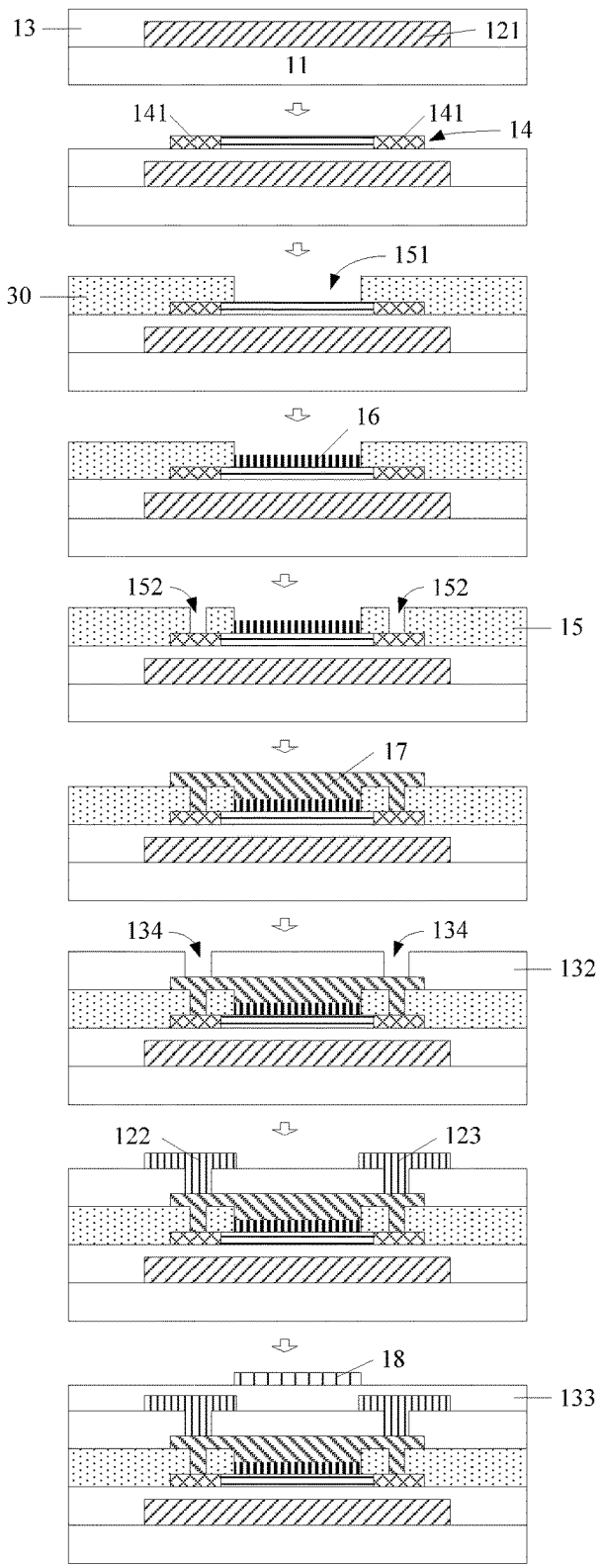
FIG. 3 is a schematic diagram of processes for manufacturing an array substrate based on the method shown in FIG. 2.

FIG. 2 is a flow chart of a manufacturing method for an array substrate according to an embodiment of the present invention. FIG. 3 is a schematic diagram of processes for manufacturing an array substrate based on the method shown in FIG. 2. For illustration, for a same element, same numerals are adopted as FIG. 1.

With reference to FIG. 2, the manufacturing method of the present embodiment includes steps S21~S28.

S21: sequentially forming a first gate electrode pattern and a first insulation layer that covers the first gate electrode pattern on a substrate.

As shown in FIG. 3, the substrate 11 can be a transparent substrate such as a glass substrate, a transparent plastic substrate, or a flexible substrate. Of course, the substrate 11 of the present embodiment can also provide with a passivation protection layer. For example, the substrate 11 can include a base plate and a passivation protection layer formed on the base plate. The base plate can be a transparent substrate such as a glass substrate, a transparent plastic substrate, or a flexible substrate. A material of the passivation protection layer can include but not limited to a silicon nitride compound such as silicon nitride ($Si_3N_4$) in order to protect a structure stability of a surface of the substrate 11.

The present embodiment can form a first gate electrode pattern 121 having a preset pattern on the substrate 11 through a mask process. Specifically, adopting a CVD (Chemical vapor deposition) method to form an entire surface of a metal layer. Then, coating an entire surface of a photoresist layer on the metal layer, and adopting a mask to sequentially perform exposing and developing to the photoresist layer. The photoresist which is fully exposed will be removed by a developer, the photoresist which is not exposed will not be removed by the developer. Then, etching the metal layer not being covered by the photoresist layer, and removing the photoresist layer. Finally, a remaining portion of the metal layer forms the first gate electrode pattern 121 of the TFT.

The present embodiment adopts a CVD method to form the first insulation layer (GI, gate insulation layer) 131 on the first gate electrode pattern 121. The first insulation layer 131 is a plane structure that covers on the first gate electrode layer 121. A material of the first insulation layer 131 can be silicon oxide (SiOx). Of course, the first insulation layer 131 can also include a silicone compound layer and a silicon nitrogen compound sequentially formed on the first gate electrode pattern 121 such as silica ($SiO_2$) and silicon nitride ($Si_3N_4$) in order to increase wear resistance ability and an insulation ability of the first insulation layer 131.

S22: forming a first semiconductor pattern on the first insulation layer, and the first semiconductor pattern is located right above the first gate electrode pattern for generating electron holes when applying with a voltage.

With reference to FIG. 3, the present embodiment can form an amorphous silicon (a-Si) pattern on the first insulation layer 131. Then, performing a hydrogen removing process to the amorphous silicon pattern, and using a metal such as aluminum or copper to induce the amorphous silicon to be crystallized. Then, performing a P-type doping to the amorphous silicon pattern. The P-type doping means doping trivalent element to the amorphous silicon pattern such as boron to replace silicon atoms in the lattice in order to form a P-type LTPS pattern.

Furthermore, the present embodiment can only perform a heavy doping to two terminals of the P-type LTPS pattern in order to form a heavy-doped region 141 at two terminals of the P-type LTPS pattern.

Of course, in another embodiment, an amorphous silicon layer having a plane structure can cover on the first insulation layer 131. Then, through a hydrogen removing treatment, a crystallization treatment and a P-type doping, a P-type LTPS having a plane structure is obtained. Then, providing a photoresist layer to cover the P-type LTPS having a plane structure, and exposing and developing the photoresist layer in order to remove the photoresist layer except a portion of the photoresist layer right above the first gate electrode pattern 121. The portion of the photoresist layer right above the first gate electrode pattern 121 is reserved, then, etching to remove the P-type LTPS not covered by the photoresist layer after being exposed in order to form a P-type LTPS pattern.

S23: forming a bank layer that covers the first semiconductor pattern, wherein the bank layer is provided with a concave slot, and forming a QLED device located in the concave slot and contacted with the first semiconductor pattern. The bank layer is also provided with two first contact holes located outside the concave slot and revealing a surface of the first semiconductor pattern.

The present embodiment can form the bank layer 15 through a mask process. Specifically:

Firstly, using a CVD method to form an entire surface of a silicone compound layer 30. Then, coating an entire surface of a photoresist layer (called a first photoresist layer) on the silicone compound layer 30, and adopting a mask to sequentially perform an exposing process and a developing process such that the first photoresist layer located right above a region between the two heavy-doped region 141 is fully exposed. The fully exposed photoresist can be removed by a developer. Then, etching the silicone compound layer 30 not covered by the first photoresist layer after present development process in order to form a concave slot 151 that reveals a surface of the first semiconductor pattern 14. Then, removing a remaining portion of the first photoresist layer.

Then, forming a QLED device 16 contacted with the first semiconductor pattern 14 in the concave slot 15. Wherein, a size of the QLED device 16 is limited by a size of the concave slot 151. The present embodiment can dispose the size of the concave slot 151 according to an actual requirement.

Furthermore, coating an entire surface of a photoresist layer (called a second photoresist layer) on the silicone compound layer 30, and adopting a mask to perform an exposing process and a development process to the second photoresist layer in order to remove the second photoresist layer located right above two heavy-doped regions 141. Then, etching to remove the silicone compound layer 30 not covered by the second photoresist layer after the present development in order to form two first contact holes that reveals surfaces of the two heavy-doped regions 141. Finally, perform an ashing process to remove a remaining portion of the second photoresist layer in order to obtain the bank layer 15.

In the above method, two mask processes are adopted to form the bank layer 15. That is the concave slot 151 and the first contact holes 152 are respectively manufactured by one mask process. In another embodiment, only one mask process can be adopted to obtain the concave slot 151 and the two first contact holes 152. Specifically, providing an entire surface of the silicone compound layer 30 to cover the first semiconductor pattern 14, and providing a photoresist layer to cover the entire surface of the silicone compound layer 30. Then, exposing and developing the photoresist layer in order to remove the photoresist layer located right above the two heavy-doped regions 141 and the photoresist layer located right above a region between the two heavy-doped regions 141. Furthermore, etching to remove the silicone compound layer 30 not covered by the photoresist layer after being developed in order to form the concave slot 151 that reveals a surface of the first semiconductor pattern and two first contact holes 152 that reveal surfaces of the two heavy-doped regions 141. Finally, perform an ashing process to remove a remaining portion of the second photoresist layer in order to obtain the bank layer 15.

S24: forming a second semiconductor pattern on the bank layer, wherein, the second semiconductor pattern is used for applying with a voltage in order to generate electrons, and the second semiconductor pattern directly covers the QLED device and the two first contact holes, and the second semiconductor pattern can electrically connect to the first semiconductor pattern through the two first contact holes.

The present embodiment can adopt a CVD method to form an IGZO layer having a plane structure on the bank layer 15. Then, coating an entire surface of a photoresist layer on the IGZO layer. Then, adopting a mask to sequentially perform exposing and developing the photoresist layer.

Then, in order to remove the photoresist layer except a portion of the photoresist layer right above the first gate electrode pattern 121. The fully exposed photoresist can be removed by a developer, and the photoresist which is not exposed will not be removed by the developer. Then, etching to remove the IGZO layer not covered by the photoresist layer after the present development in order to form the second semiconductor pattern 17 as shown in FIG. 3.

S25: forming a second insulation layer that covers the second semiconductor pattern, wherein, the second insulation layer is provided with two second contact holes that reveal a surface of the second semiconductor pattern.

S26: forming a source electrode pattern and a drain electrode pattern which are disposed separately on the second insulation layer, wherein, the source electrode pattern and the drain electrode pattern cover the two second contact holes, and the source electrode pattern and the drain electrode pattern can electrically connect to the second semiconductor pattern through the two second contact holes.

S27: forming a third insulation layer that covers the source electrode pattern and the drain electrode pattern.

S28: forming a second gate electrode pattern on the third insulation layer, wherein, the second gate electrode pattern is a transparent electrode pattern and located right above the QLED device.

The manufacturing principle and process of the second insulation layer 132, the source electrode pattern 122, the drain electrode pattern 123, the third insulation layer 133 and the second gate electrode pattern 18 can refer to the conventional technology, no more repeating here.

The method of the present embodiment can obtain an array substrate having the same structure as shown in FIG. 1. Accordingly, the present embodiment also has above beneficial effect.

Figure 4:
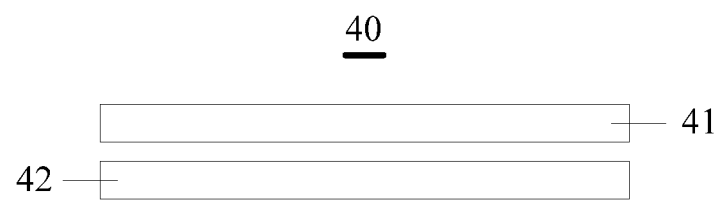
FIG. 4 is a cross-sectional view of a display panel according to an embodiment of the present invention.

The embodiment of the present invention also provides a display panel, as shown in FIG. 4. The display panel 40 includes a first substrate 41 and a second substrate 42. The array substrate 10 can be anyone of the two substrates. Accordingly, the present embodiment also has above beneficial effect.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. An array substrate, comprising:
   a base;
   a first gate electrode pattern formed on the base and a first insulation layer covered on the first gate electrode pattern;
   a first semiconductor pattern formed on the first insulation layer, wherein, the first semiconductor pattern is located right above the first gate electrode pattern for generating electron holes when applying with a voltage;
   a bank layer that covers the first semiconductor pattern, wherein, the bank layer is provided with a concave slot and two first contact holes located outside the concave slot, the concave slot and the two first contact holes all reveal a surface of the first semiconductor pattern;
   a QLED device formed in the concave slot and contacted with the first semiconductor pattern;
   a second semiconductor pattern formed on the bank layer for generating electrons when applying with a voltage, wherein, the second semiconductor pattern directly covers on the QLED device and the two first contact holes, and electrically connected to the first semiconductor pattern through the two first contact holes;
a second insulation layer covered on the second semiconductor pattern, wherein, the second insulation layer is provided with two second contact holes that reveal a surface of the second semiconductor pattern;
source electrode pattern and a drain electrode pattern disposed separately on the second insulation layer, wherein, the source electrode pattern and the drain electrode pattern cover the two second contact holes, and the source electrode pattern and the drain electrode pattern are electrically connected to the second semiconductor pattern through the two second contact holes;
a third insulation layer covered on the source electrode pattern and the drain electrode pattern; and
a second gate electrode pattern formed on the third insulation layer, wherein, the second gate electrode pattern is a transparent electrode pattern and located right above the QLED device.

2. The array substrate according to claim 1, wherein, the first semiconductor pattern includes a P-type LTPS (Low Temperature Poly-silicon) pattern, and the second semiconductor pattern includes an N-type IGZO (Indium Gallium Zinc Oxide) pattern.

3. The array substrate according to claim 2, wherein, the P-type LTPS pattern further includes a heavy-doped region located at two terminals of the P-type LTPS pattern, and the second semiconductor pattern is electrically connected to the heavy-doped region of the first semiconductor pattern through the two first contact holes.

4. A display panel, comprising:
two substrates, wherein one of the substrates is an array substrate, and the array substrate comprises:
a base;
a first gate electrode pattern formed on the base and a first insulation layer covered on the first gate electrode pattern;
a first semiconductor pattern formed on the first insulation layer, wherein, the first semiconductor pattern is located right above the first gate electrode pattern for generating electron holes when applying with a voltage;
a bank layer that covers the first semiconductor pattern, wherein, the bank layer is provided with a concave slot and two first contact holes located outside the concave slot, the concave slot and the two first contact holes all reveal a surface of the first semiconductor pattern;
a QLED device formed in the concave slot and contacted with the first semiconductor pattern;
a second semiconductor pattern formed on the bank layer for generating electrons when applying with a voltage, wherein, the second semiconductor pattern directly covers on the QLED device and the two first contact holes, and electrically connected to the first semiconductor pattern through the two first contact holes;
a second insulation layer covered on the second semiconductor pattern, wherein, the second insulation layer is provided with two second contact holes that reveal a surface of the second semiconductor pattern;
source electrode pattern and a drain electrode pattern disposed separately on the second insulation layer, wherein, the source electrode pattern and the drain electrode pattern cover the two second contact holes, and the source electrode pattern and the drain electrode pattern are electrically connected to the second semiconductor pattern through the two second contact holes;
a third insulation layer covered on the source electrode pattern and the drain electrode pattern; and
a second gate electrode pattern formed on the third insulation layer, wherein, the second gate electrode pattern is a transparent electrode pattern and located right above the QLED device.

5. The display panel according to claim 4, wherein, the first semiconductor pattern includes a P-type LTPS (Low Temperature Poly-silicon) pattern, and the second semiconductor pattern includes an N-type IGZO (Indium Gallium Zinc Oxide) pattern.

6. The display panel according to claim 5, wherein, the P-type LTPS pattern further includes a heavy-doped region located at two terminals of the P-type LTPS pattern, and the second semiconductor pattern is electrically connected to the heavy-doped region of the first semiconductor pattern through the two first contact holes.

7. A manufacturing method for an array substrate, comprising steps of:
sequentially forming a first gate electrode pattern and a first insulation layer that covers the first gate electrode pattern on a base;
forming a first semiconductor pattern on the first insulation layer, and the first semiconductor pattern is located right above the first gate electrode pattern for generating electron holes when applying with a voltage;
forming a bank layer covering the first semiconductor pattern, wherein the bank layer is provided with a concave slot, and forming a QLED device located in the concave slot and contacted with the first semiconductor pattern, wherein, the bank layer is also provided with two first contact holes located outside the concave slot and revealing a surface of the first semiconductor pattern;
forming a second semiconductor pattern on the bank layer, wherein, the second semiconductor pattern is used for applying with a voltage in order to generate electrons, and the second semiconductor pattern directly covers the QLED device and the two first contact holes, and the second semiconductor pattern can electrically connect to the first semiconductor pattern through the two first contact holes;
forming a second insulation layer that covers the second semiconductor pattern, wherein, the second insulation layer is provided with two second contact holes that reveal a surface of the second semiconductor pattern;
forming a source electrode pattern and a drain electrode pattern which are disposed separately on the second insulation layer, wherein, the source electrode pattern and the drain electrode pattern cover the two second contact holes, and the source electrode pattern and the drain electrode pattern can electrically connect to the second semiconductor pattern through the two second contact holes; and
forming a second gate electrode pattern on the third insulation layer, wherein, the second gate electrode pattern is a transparent electrode pattern and located right above the QLED device.

8. The method according to claim 7, wherein, the step of forming a first semiconductor pattern on the first insulation layer comprises step of:
forming an amorphous silicon pattern on the first insulation layer; and sequentially performing a crystallization treatment and a P-type doping to the amorphous silicon pattern in order to obtain a P-type LTPS (Low Temperature Poly-silicon) pattern.

9. The method according to claim 8, wherein, the amorphous silicon pattern is a plane structure that covers the first insulation layer, the P-type LTPS pattern is a plane structure that covers the first insulation layer, and after obtaining the P-type LTPS pattern, the step of forming a first semiconductor pattern on the first insulation layer further comprises:

providing a photoresist layer to cover the P-type LTPS pattern;

exposing the photoresist layer in order to remove the photoresist layer except a portion of the photoresist layer located right above the gate electrode pattern; and etching to remove the P-type LTPS pattern that is not covered by the photoresist layer after being exposed.

10. The method according to claim 8, wherein, after obtaining the P-type LTPS pattern, the step of forming a first semiconductor pattern on the first insulation layer further comprises:

performing a heavy doping to two terminals of the P-type LTPS pattern in order to form two heavy-doped regions at two terminals of the P-type LTPS pattern.

11. The method according to claim 10, wherein, the step of forming a bank layer covering the first semiconductor pattern, wherein the bank layer is provided with a concave slot, and forming a QLED device located in the concave slot and contacted with the first semiconductor pattern, wherein, the bank layer is also provided with two first contact holes located outside the concave slot and revealing a surface of the first semiconductor pattern comprises step of:

providing an entire surface of the bank layer to cover the first semiconductor pattern;

providing a first photoresist layer to cover the entire surface of the bank layer;

exposing the first photoresist layer in order to remove a portion of the first photoresist layer located right above a region between the two heavy-doped regions;

etching a portion of the bank layer that is not covered by the first photoresist layer after being exposed so as to form the concave slot that reveals a surface of the first semiconductor pattern;

removing a remaining portion of the first photoresist;

forming the QLED device that contacts with the first semiconductor pattern in the concave slot;

providing a second photoresist layer to cover the bank layer;

exposing the second photoresist layer in order to remove a portion of the second photoresist layer located right above the two heavy-doped regions;

etching a portion of the bank layer that is not covered by the second photoresist layer after being exposed in order to form two first contact holes that reveal surfaces of the heavy-doped regions; and removing a remaining portion of the second photoresist layer.

12. The method according to claim 10, wherein, the step of forming a bank layer covering the first semiconductor pattern, wherein the bank layer is provided with a concave slot, and forming a QLED device located in the concave slot and contacted with the first semiconductor pattern, wherein, the bank layer is also provided with two first contact holes located outside the concave slot and revealing a surface of the first semiconductor pattern comprises step of:

providing an entire surface of the bank layer to cover the first semiconductor pattern;

providing a photoresist layer to cover the entire surface of the bank layer;

exposing the photoresist layer in order to remove a portion of the photoresist layer located right above the two heavy-doped regions and located right above a region between the two heavy-doped regions;

etching a portion of the bank layer that is not covered by the photoresist layer after being exposed so as to form the concave slot that reveals a surface of the first semiconductor pattern and two first contact holes that reveal surfaces of the two heavy-doped regions; and forming the QLED device that contacts with the first semiconductor pattern in the concave slot.

* * * * *